(12) United States Patent
Seo et al.

(10) Patent No.: US 10,193,095 B2
(45) Date of Patent: Jan. 29, 2019

(54) DISPLAY DEVICE

(71) Applicant: SAMSUNG DISPLAY CO., LTD., Yongin-si, Gyeonggi-Do (KR)

(72) Inventors: Tae An Seo, Hwaseong-si (KR); Jung Hun Lee, Hwaseong-si (KR); Jin Hwan Choi, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/660,093

(22) Filed: Jul. 26, 2017

(65) Prior Publication Data
US 2018/0033992 A1 Feb. 1, 2018

(30) Foreign Application Priority Data
Jul. 27, 2016 (KR) .................. 10-2016-0095570

(51) Int. Cl.
*G06F 1/16* (2006.01)
*H01L 51/50* (2006.01)
(Continued)

(52) U.S. Cl.
CPC ........ *H01L 51/5012* (2013.01); *G06F 1/1601* (2013.01); *G06F 1/1626* (2013.01);
(Continued)

(58) Field of Classification Search
CPC ............. H01L 51/5012; H01L 51/5072; G06F 1/1601; G06F 1/1626; G06F 1/1652;
(Continued)

(56) References Cited

U.S. PATENT DOCUMENTS 6,859,219 B1 * 2/2005 Sall ...................... G06F 1/1607
345/1.1
7,623,341 B1 * 11/2009 Salvat .................. G06F 1/1607
345/905
(Continued)

FOREIGN PATENT DOCUMENTS

KR 10-2012-0117140 10/2012
KR 10-2014-0054498 5/2014
(Continued)

*Primary Examiner* — Hoa C Nguyen
*Assistant Examiner* — Keith Depew
(74) *Attorney, Agent, or Firm* — F. Chau & Associates, LLC

(57) ABSTRACT

A display device includes first and second guide plates facing each other, a pair of first and second guide rails disposed in the first and second guide plates, a first supporting plate disposed between the first guide rails and of the first and second guide plates, the first supporting plate having opposite end portions fixed to a first position of the first and second guide plates, a second supporting plate having opposite end portions coupled to the pair of first guide rails, a third supporting plate having opposite end portions coupled to the pair of second guide rails, and a display panel supported by at least one of the first to third supporting plates. The pair of first guide rails extends from the first position to a second position. The pair of second guide rails extends from the first position to a third position.

24 Claims, 19 Drawing Sheets

(51) Int. Cl.
*G09G 3/30* (2006.01)
*G02F 1/1333* (2006.01)

(52) U.S. Cl.
CPC .......... *G06F 1/1641* (2013.01); *G06F 1/1652* (2013.01); *G09G 3/30* (2013.01); *H01L 51/5072* (2013.01); *G02F 1/133305* (2013.01); *G06F 2200/1612* (2013.01); *H01L 51/5092* (2013.01)

(58) Field of Classification Search
CPC . G06F 1/1641; G06F 2200/1612; G09G 3/30; G02F 1/133305
See application file for complete search history.

(56) References Cited

U.S. PATENT DOCUMENTS

| | | | | |
|---|---|---|---|---|
| 7,752,789 B2* | 7/2010 | Sun | ........................ | G06F 1/1601 108/70 |
| 8,379,377 B2* | 2/2013 | Walters | .................. | G06F 1/1641 248/917 |
| 8,711,566 B2 | 4/2014 | O'Brien | | |
| 9,195,272 B2 | 11/2015 | O'Brien | | |
| 9,398,125 B1* | 7/2016 | Hall | ........................ | G06F 1/1652 |
| 9,519,313 B2* | 12/2016 | Kim | ........................ | G06F 1/166 |
| 2005/0270730 A1* | 12/2005 | Klushin | ................. | G06F 1/1601 361/679.27 |
| 2006/0082518 A1* | 4/2006 | Ram | ...................... | G06F 1/1601 345/1.1 |
| 2006/0214871 A1* | 9/2006 | Iwamura | ............... | G06F 1/1601 345/1.1 |
| 2007/0097615 A1* | 5/2007 | Liao | ........................ | A45D 33/26 361/679.55 |
| 2007/0127196 A1* | 6/2007 | King, Jr. | ................ | G06F 1/1616 361/679.04 |
| 2007/0136405 A1* | 6/2007 | Weinstein | .............. | G06F 1/1677 708/130 |
| 2007/0247798 A1* | 10/2007 | Scott, II | ................. | G06F 1/1616 361/679.04 |
| 2007/0285343 A1* | 12/2007 | Han | ....................... | G06F 1/1616 345/1.3 |
| 2008/0198096 A1* | 8/2008 | Jung | ..................... | G06F 1/1616 345/1.3 |
| 2010/0053027 A1* | 3/2010 | Tonnison | .............. | G06F 1/1601 345/1.3 |
| 2011/0050543 A1* | 3/2011 | Chien | .................... | G06F 1/1616 345/1.3 |
| 2011/0291915 A1* | 12/2011 | Tani | ...................... | G06F 1/1622 345/1.3 |
| 2012/0127061 A1* | 5/2012 | Pegg | ...................... | H04M 1/0247 345/1.1 |
| 2013/0027422 A1* | 1/2013 | Kennedy | ................ | G06F 3/1423 345/619 |
| 2015/0169274 A1* | 6/2015 | Holung | ................. | G06F 3/1423 345/1.3 |
| 2016/0040462 A1* | 2/2016 | Nakamura | .......... | H04M 1/0247 361/679.27 |
| 2018/0077808 A1* | 3/2018 | Seo | ......................... | G06F 3/044 |
| 2018/0189012 A1* | 7/2018 | Fang | ..................... | G06F 1/1681 |

FOREIGN PATENT DOCUMENTS

| | | |
|---|---|---|
| KR | 10-2014-0059274 | 5/2014 |
| KR | 10-1408987 | 6/2014 |
| KR | 10-2015-0094833 | 8/2015 |
| KR | 10-2015-0099676 | 9/2015 |
| KR | 10-1570869 | 11/2015 |

* cited by examiner

DISPLAY DEVICE

CROSS-REFERENCE TO RELATED APPLICATION

This application claims priority under 35 U.S.C. § 119 to Korean Patent Application No. 10-2016-0095570, filed in the Korean Intellectual Property Office on Jul. 27, 2016, the disclosure of which is incorporated by reference herein in its entirety.

TECHNICAL FIELD

The present invention relates to a display device.

DISCUSSION OF THE RELATED ART

Generally known display devices include liquid crystal display (LCD) devices, plasma display panel (PDP) devices, organic light emitting diode (OLED) display devices, field effect display (FED) devices, electrophoretic display devices, and the like.

An, the OLED display device may include two electrodes and an organic emission layer interposed between the two electrodes. Electrons injected from one electrode and holes injected from the other electrode are combined in the organic emission layer to generate excitons. The excitons release energy in the form of light.

An OLED display device may be thin and light since it is self-luminous. In addition, an OLED display device may feature a high image quality, low power consumption, a high luminance, and a high response speed.

An OLED display device may be flexible.

SUMMARY

According to an exemplary embodiment of the present invention, a display device includes first and second guide plates facing each other, a pair of first guide rails disposed in the first and second guide plates, respectively, a pair of second guide rails disposed in the first and second guide plates, respectively, a first supporting plate disposed between the first guide rails and the second guide rails at the first guide plate and the first and second guide rails at the second guide plate, wherein the first supporting plate has opposite end portions fixed to a first position of the first and second guide plates, a second supporting plate configured to have opposite end portions coupled to the pair of first guide rails, a third supporting plate configured to have opposite end portions coupled to the pair of second guide rails, and a display panel supported by at least one of the first to third supporting plates. The pair of first guide rails are respectively formed to extend from the first position to a second position. The pair of second guide rails are respectively formed to extend from the first position to a third position. The first position is disposed between the second position and the third position.

According to an exemplary embodiment of the present invention, a flexible display device includes a flexible display panel stored in a first panel accommodating portion and having a first end protruding from the first panel accommodating portion, wherein the protruding first end of the flexible display panel is attached to a second panel accommodating portion, a first supporting plate having a first planar surface and a first end connected to a first guide plate and a second end connected to a second guide plate, the first and second ends of the first guide plate being opposite to each other in a first direction, and a second supporting plate having a second planar surface and a first end connected to the first guide plate and a second end connected to the second guide plate, the first and second ends of the second guide plate being opposite to each other in the first direction. The first guide plate includes a first rail extending in a second direction crossing the first direction, the second guide plate includes a second rail extending in the second direction. The second supporting plate is coupled to the first and second rails and is configured to slide on the first and second rails in the second direction from a first position, in which the first and second planar surfaces overlap each other and are disposed at different elevations with respect to each other, to a second position, in which the second planar surface is disposed adjacent to the first planar surface, without overlapping the first planar surface, at substantially a same elevation as the elevation of the first planar surface. The first panel accommodating portion is attached an edge of the first supporting plate, between the first and second ends of the first supporting plate, and the second panel accommodating portion is attached to an edge of second supporting plate, between the first and second ends of the second supporting plate, such that when the second panel accommodating portion is moved in the second direction to slide the second supporting plate from the first position to the second position, the flexible display panel is protruded from the first panel accommodating portion to be disposed on the first and second planar surfaces.

BRIEF DESCRIPTION OF THE DRAWINGS

The above and other features of the present invention will become more apparent by describing in detail exemplary embodiments thereof in conjunction with the accompanying drawings, in which.

DETAILED DESCRIPTION OF THE EMBODIMENTS

Figure 1:
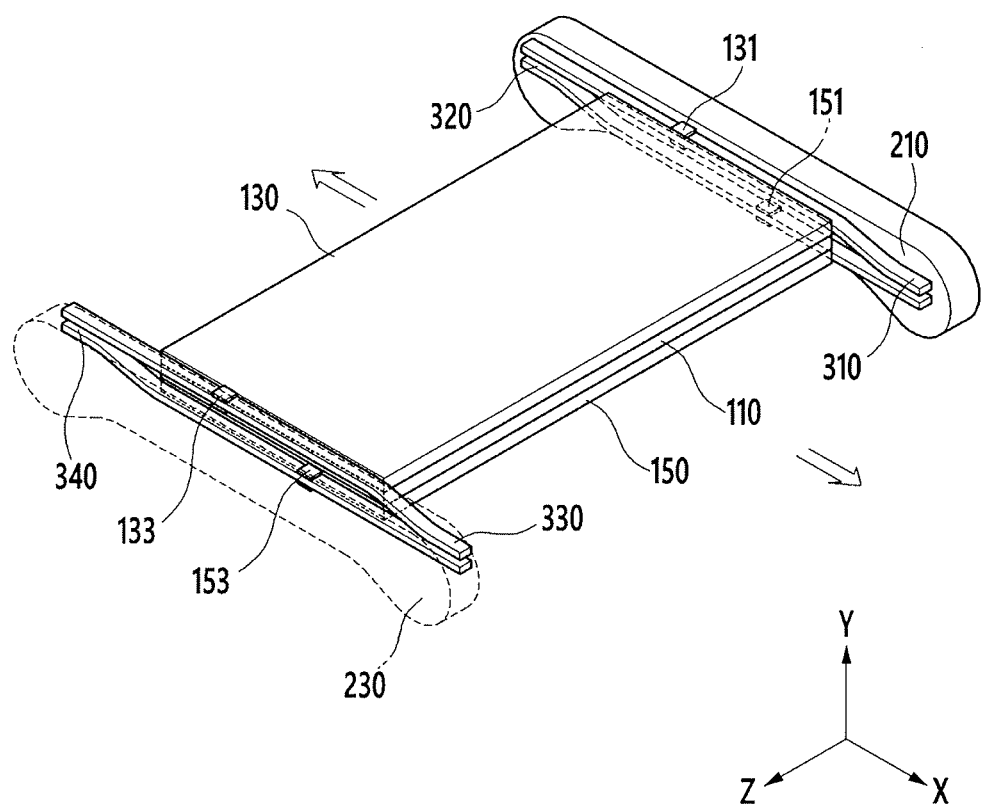
FIG. 1 and FIG. 2 are perspective views illustrating a display device according to an exemplary embodiment of the present invention.

Hereinafter, exemplary embodiments of the present invention will be described in detail with reference to the accompanying drawings. The described exemplary embodiments may be modified in various ways without departing from the spirit and scope of the present invention. Like reference numerals may refer to like elements throughout the specification.

In the drawings, the size and thickness of layers, films, panels, regions, etc., may be exaggerated for clarity. It will be understood that when an element such as a layer, film, region, or substrate is referred to as being "on" another element, it can be directly on the other element or intervening elements may also be present therebetween.

Hereinafter, a display device, according to an exemplary embodiment of the present invention, will be described with reference to FIG. 1 to FIG. 10.

Figure 2:
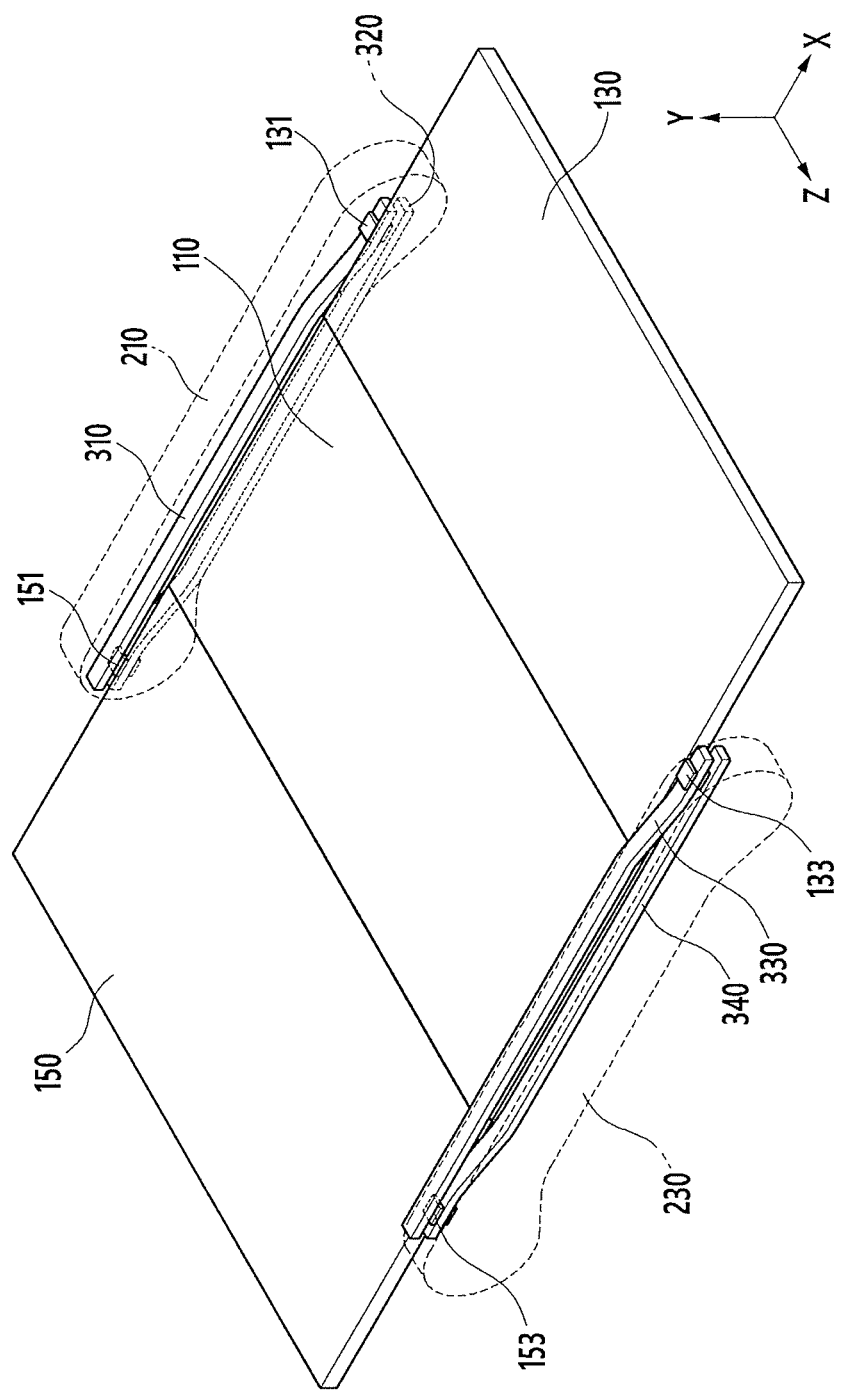
Figure 3:
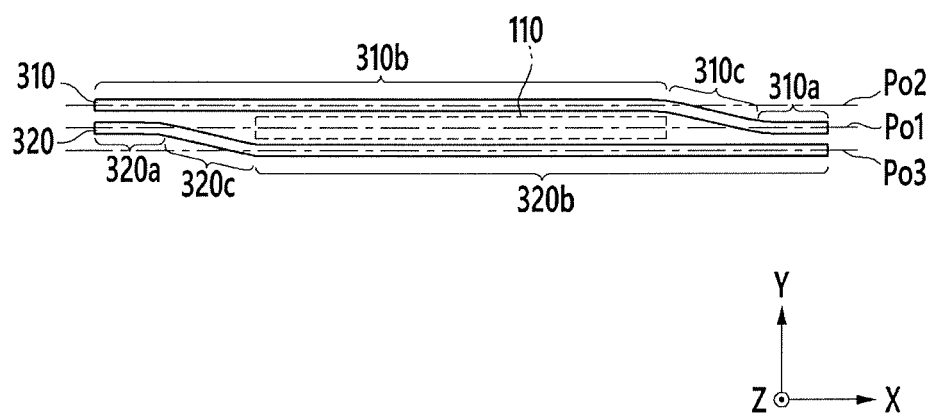
FIG. 3 illustrates a relationship between first and second guide rails of FIG. 1, according to an exemplary embodiment of the present invention.
Figure 4:
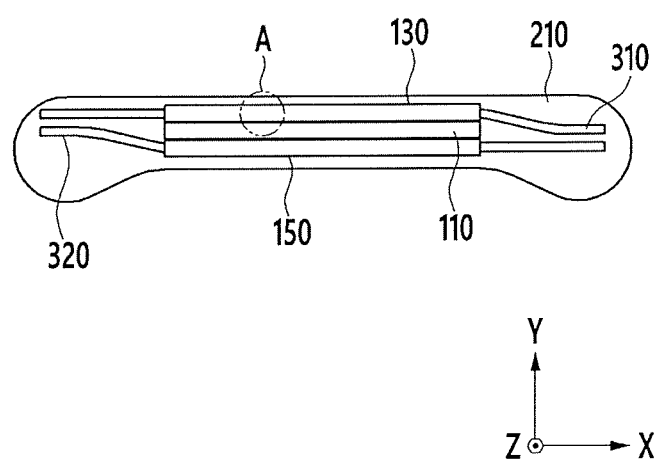
FIG. 4 and FIG. 5 illustrate operations of first to third supporting plates, according to an exemplary embodiment of the present invention.
Figure 5:
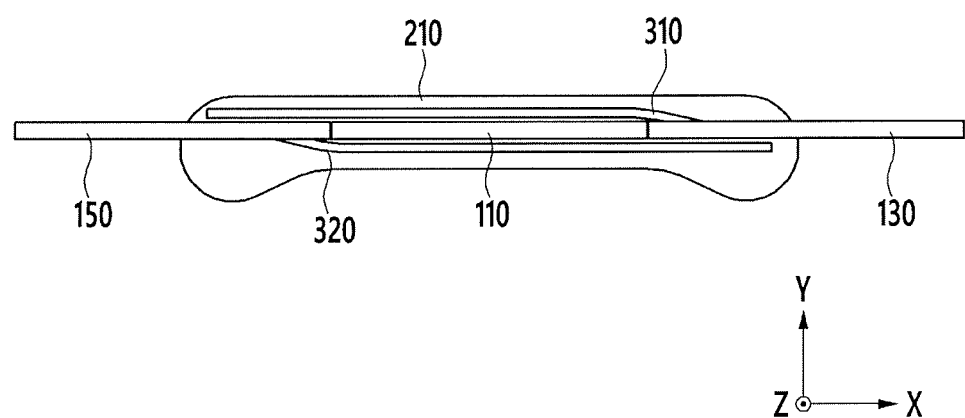
Figure 6:
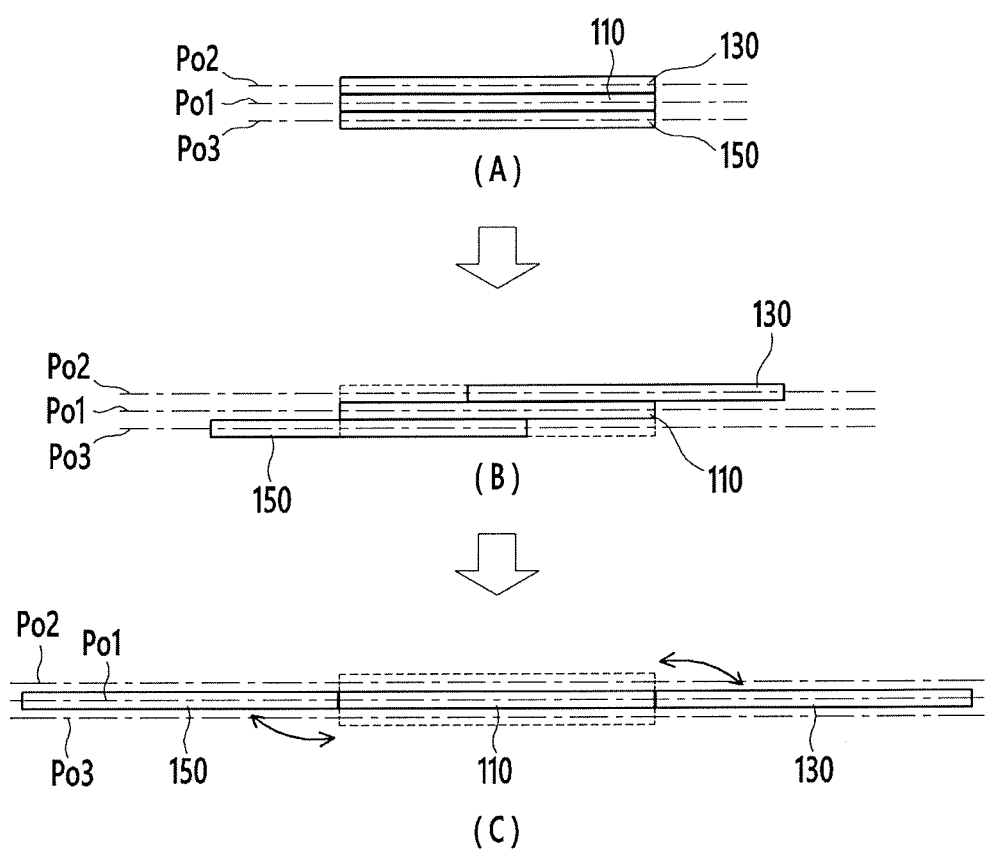
FIG. 6 illustrates a relationship between the first to third supporting plates, according to an exemplary embodiment of the present invention.
Figure 7:
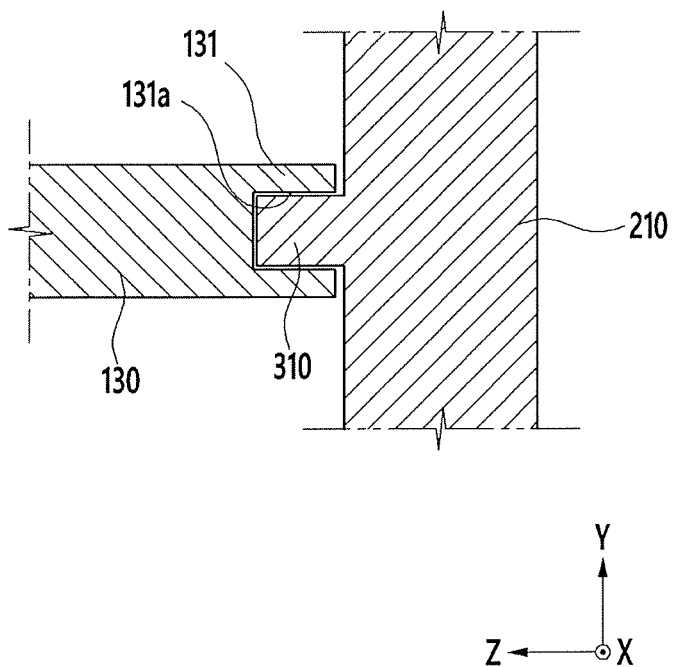
FIG. 7 is an enlarged cross-sectional view illustrating a region A of FIG. 4, according to an exemplary embodiment of the present invention.
Figure 8:
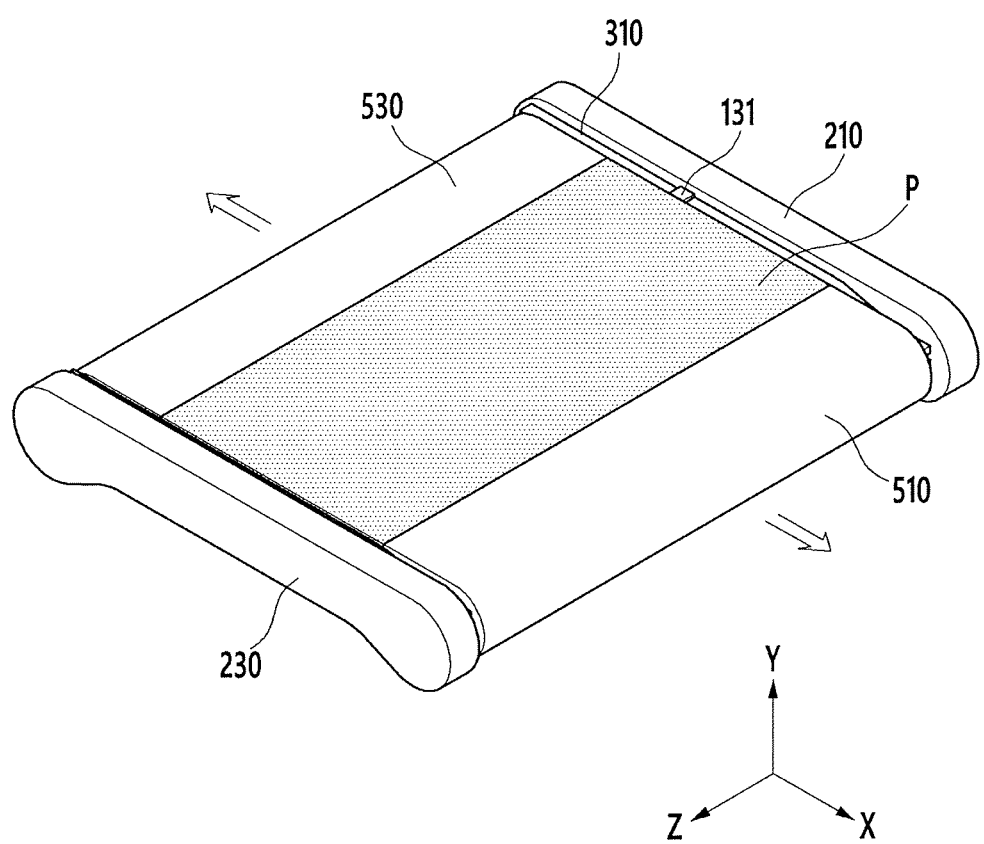
FIG. 8 and FIG. 9 are perspective views illustrating first and second panel accommodating portions coupled to the display device of FIG. 1 and FIG. 2, according to an exemplary embodiment of the present invention.
Figure 9:
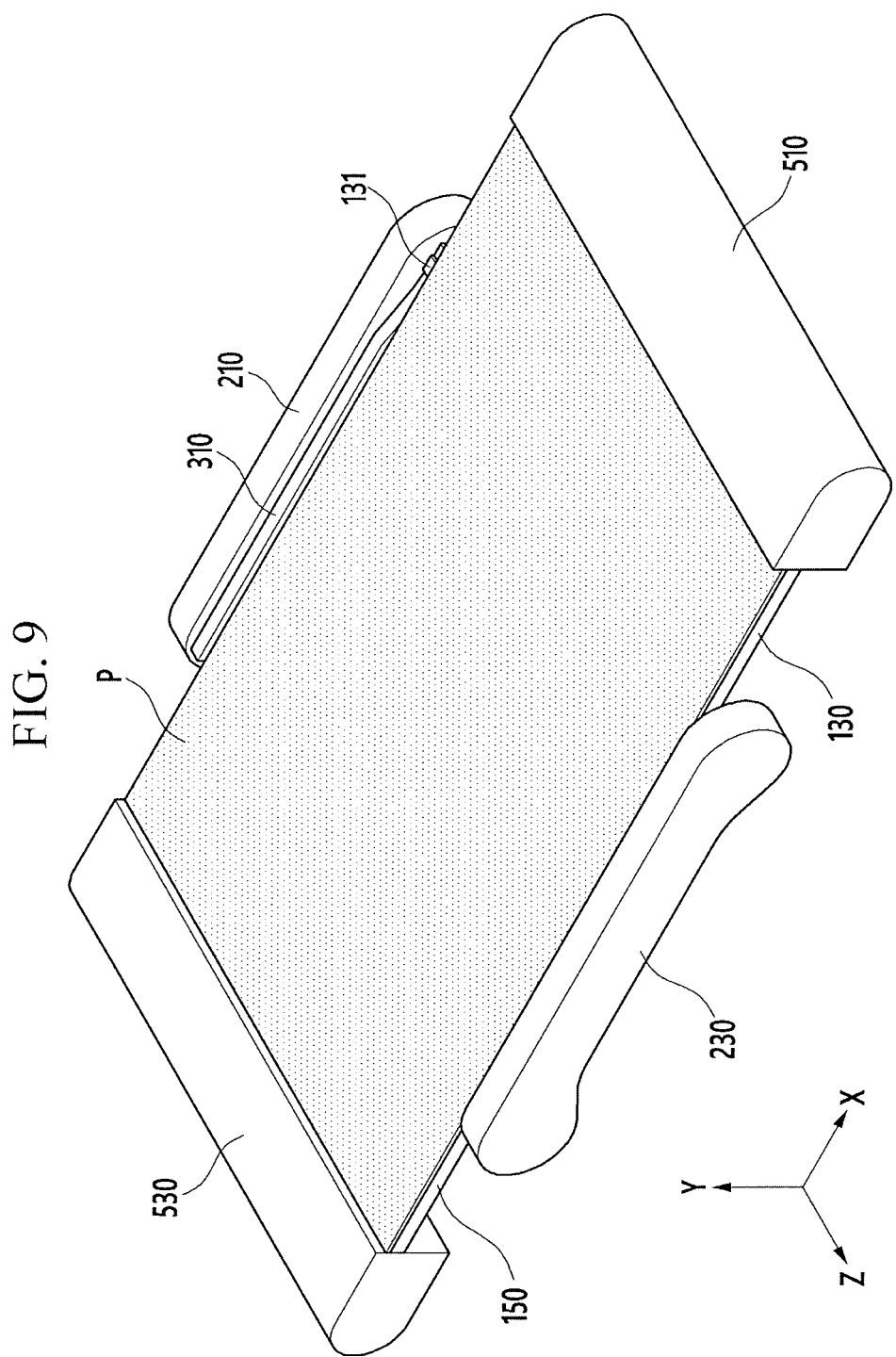
Figure 10:
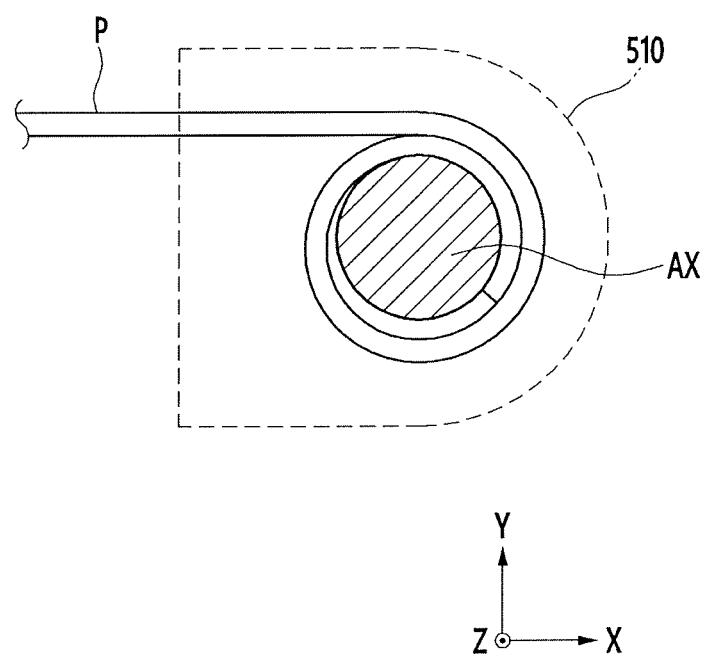
FIG. 10 illustrates a structure of the first panel accommodating portion, according to an exemplary embodiment of the present invention.

FIG. 1 and FIG. 2 are perspective views illustrating a display device according to an exemplary embodiment of the present invention. FIG. 3 illustrates a relationship between first and second guide rails of FIG. 1, according to an exemplary embodiment of the present invention. FIG. 4 and FIG. 5 illustrate operations of first to third supporting plates, according to an exemplary embodiment of the present invention. FIG. 6 illustrates a relationship between the first to third supporting plates, according to an exemplary embodiment of the present invention. FIG. 7 is an enlarged cross-sectional view illustrating a region A of FIG. 4, according to an exemplary embodiment of the present invention. FIG. 8 and FIG. 9 are perspective views illustrating first and second panel accommodating portions coupled to the display device of FIG. 1 and FIG. 2, according to an exemplary embodiment of the present invention. FIG. 10 illustrates a structure of the first panel accommodating portion, according to an exemplary embodiment of the present invention.

As shown in FIG. 1 and FIG. 2, a display device, according to an exemplary embodiment of the present invention, may include a first guide plate 210, a second guide plate 230, a pair of first guide rails 310 and 330, a pair of second guide rails 320 and 340, a first supporting plate 110, a second supporting plate 130, a third supporting plate 150, and a display panel P (see FIG. 8 and FIG. 9). In an exemplary embodiment of the present invention, as the second supporting plate 130 and the third supporting plate 150 are respectively moved along the pair of first guide rails 310 and 330 and the pair of second guide rails 320 and 340, the first to third supporting plates 110, 130, and 150 may be slid open to form an enlarged planar surface. The enlarged planar surface may include the surfaces of the first to third supporting plates 110, 130, and 150, disposed next to each other. The first to third supporting plates 110, 130, and 150 may be disposed next to each other after being slid open along the pairs of first and second guide rails 310 and 330 and 320 and 340. In other words, the second supporting plate 130 may be slid on the pair of first guide rails 310 and 330 in a first direction, and the third supporting plate 150 may be slid on the pair of second guide rails 320 and 340 in a second direction opposite to the first direction such that the first, second and third supporting plates 110, 130 and 150 may form a planar surface (e.g., an enlarged planar surface including the surfaces of the, second and third supporting plates 110, 130 and 150). Accordingly, when the display panel P is unfolded, the first to third supporting plates 110, 130, and 150 can strongly support the display panel P.

The first guide plate 210 and the second guide plate 230, which include the first guide rails 310 and 330 and the second guide rails 320 and 340, may be disposed to face each other. The first guide plate 210 and the second guide plate 230 may be separately by a predetermined interval such that the first to third supporting plates 110, 130, and 150 are disposed between the first guide plate 210 and the second guide plate 230. The first guide plate 210 and the second guide plate 230 may have the same shape.

In an exemplary embodiment of the present invention, the pair of first guide rails 310 and 330 may be respectively disposed in the first guide plate 210 and the second guide plate 230. For example, the first guide rail 310 may be disposed in the first guide plate 210, and the first guide rail 330 may be disposed in the second guide plate 230.

The first guide rail 310 and the first guide rail 330 may be respectively disposed at the same position (e.g., corresponding positions) of the first guide plate 210 and the second guide plate 230. Accordingly, the first guide rail 310 and the first guide rail 330 may be disposed to face each other.

Referring to FIG. 3, the first guide rail 310 may include a bar-type member (e.g., rail) to extend in an X-axis direction. However, as the first guide rail 310 extends in the X-axis direction, the position of the first guide rail 310 may be changed, for example, along an Y-axis direction crossing the X-axis direction.

The first guide rail 310 may include a first flat portion 310a, a second flat portion 310b, and a first connector 310c. The first flat portion 310a may be disposed at a first position Po1, and may be disposed in parallel with the X-axis direction. The second flat portion 310b may be disposed at a second position Po2 above the first position Po1, and may be disposed in parallel with the X-axis direction. A length of the second flat portion 310b may be longer than that of the first flat portion 310a. The first flat portion 310a, the second flat portion 310b, and the first connector 310c may be integrally formed. In other words, the first flat portion 310a, the second flat portion 310b, and the first connector 310c may form one continuous rail, for example, the first guide rail 310.

The first connector 310c serves to connect the first flat portion 310a with the second flat portion 310b. The position of the first guide rail 310 may be changed from the first position Po1 to the second position Po2, in the X-axis direction, by the first connector 310c.

In an exemplary embodiment of the present invention, the second guide rail 320 may be disposed to be separated from the first guide rail 310. The second guide rail 320 may be disposed to be separated in the Y-axis direction from the first guide rail 310.

The second guide rail 320 may be formed of a bar-type member to extend in the X-axis direction. As the second guide rail 320 extends in the X-axis direction, the position of the second guide rail 320 may be changed along the Y-axis direction, as shown in FIG. 3.

The second guide rail 320 may include a third flat portion 320a, a fourth flat portion 320b, and a second connector 320c. The third flat portion 320a may be disposed at the first position Po1, and may be disposed in parallel with the X-axis direction. The fourth flat portion 320b may be disposed at a second position Po2, above the first position Po1, and may be disposed in parallel with the X-axis direction. A length of the fourth flat portion 320*b* may be longer than that of the third flat portion 320*a*. The third flat portion 320*a*, the fourth flat portion 320*b*, and the second connector 320*c* may be integrally formed. In other words, the third flat portion 320*a*, the fourth flat portion 320*b*, and the second connector 320*c* may form one continuous rail, for example, the second guide rail 320.

The second connector 320*c* serves to connect the third flat portion 320*a* with the fourth flat portion 320*b*. While moving in the X-axis direction along the second connector 320*c*, the second guide rail 320 may change position from the first position Po1 to a third position Po3. The first and third positions Po1 and Po3 are separated from each other along the Y-axis direction, as shown in FIG. 3.

Accordingly, in an exemplary embodiment of the present invention, as the first guide rail 310 extends in the X-axis direction, the position of the first guide rail 310 may be changed from the first position Po1 to the second position Po2, or from the second position Po2 to the first position Po1. Similarly, as the second guide rail 320 extends in the X-axis direction, the position of the second guide rail 320 may be changed from the first position Po1 to the third position Po3, or from third position Po3 to the first position Po1.

The second flat portion 310*b* of the first guide rail 310 may be overlapped with the fourth flat portion 320*b* of the second guide rail 320 in the Y-axis direction. As a result, the second flat portion 310*b* and the fourth flat portion 320*b* may be overlapped with each other when seen in a plan view.

A first end portion of the first supporting plate 110 may be fixed and coupled between the first guide rail 310 and the second guide rail 320. For example, the first supporting plate 110 may be disposed between the second flat portion 310*b* and the fourth flat portion 320*b*.

The first supporting plate 110 may be disposed at the first position Pol, and may be disposed in parallel with the X-axis direction. The first flat portion 310*a* and the third flat portion 320*a* may be disposed at opposite sides of the first supporting plate 110 in the X-axis direction. A detailed position of the first supporting plate 110 will be described below.

Referring to FIG. 1 and FIG. 2, the first guide rail 330 and the second guide rail 340 may be disposed in the second guide plate 230. The first guide rail 330 and the second guide rail 340, and the first guide rail 310 and the second guide rail 320, may be disposed to be symmetrical to each other with respect to a X-Y plane.

Opposite end portions of the first supporting plate 110 may be fixed and coupled to the first guide plate 210 and the second guide plate 230, respectively. In this case, the opposite end portions of the first supporting plate 110 indicate end portions that face the first guide plate 210 and the second guide plate 230 in a Z-axis direction. The Z-axis direction may cross the X and Y-axis directions.

The first supporting plate 110 may be fixed at the first positions Po1 of the first guide plate 210 and the second guide plate 230. The first supporting plate 110 may be fixed to the first guide plate 210 and the second guide plate 230, instead of being moved.

The first supporting plate 110 may have a plate-like shape having a quadrangular plane. When the stacked first to third supporting plates 150 are slid open on the first and second guide rails 310, 330, 320 and 340, the first supporting plate 110 may support a portion of the display panel P (see FIG. 8 and FIG. 9).

In an exemplary embodiment of the present invention, the display panel P may display images by emitting light. The display panel P may not only be a display panel of an organic light emitting diode (OLED) display, but may also be a display panel used in a liquid crystal display (LCD), a plasma display device (PDP), a field emission display (FED), an electrophoretic display, or the like.

The second supporting plate 130 may have a plate-like shape having a quadrangular plane. Further, when the first to third supporting plates 110, 130, and 150 are slid open, the second supporting plate 130 may support the display panel P (see FIG. 8 and FIG. 9) together with the first supporting plate 110.

In an exemplary embodiment of the present invention, the second supporting plate 130 may slide along the pair of first guide rails 310 and 330. In other words, the second supporting plate 130 may be moved along the pair of first guide rails 310 and 330.

Opposite end portions of the second supporting plate 130 may be slidably coupled to the pair of first guide rails 310 and 330. The opposite end portions of the second supporting plate 130 indicate end portions that face the first guide plate 210 and the second guide plate 230 in the Z-axis direction.

A pair of first sliding portions 131 and 133 may be coupled to opposite end portions of the second supporting plate 130. The first sliding portion 131 may be coupled to an end portion of the second supporting plate 130 which faces the first guide plate 210. The first sliding portion 133 may be coupled to an end portion of the second guide plate 230.

The first sliding portion 131 may slide along the first guide rail 310, and the first sliding portion 133 may slide along the first guide rail 330. Detailed configurations of the first sliding portions 131 and 133 will be described below.

When the second supporting plate 130 slides along the pair of first guide rails 310 and 330, the second supporting plate 130 may be disposed at the first position Po1 or the second position Po2. For example, referring to FIG. 1, FIG. 3, and FIG. 4, when the first sliding portion 131 of the second supporting plate 130 is positioned at the second flat portion 310*b* of the first guide rail 310, the second supporting plate 130 may be disposed at the second position Po2. In this case, the second supporting plate 130 and the first supporting plate 110 may be disposed to overlap each other in a vertical direction, e.g., in the Y-axis direction.

However, referring to FIG. 2, FIG. 3, and FIG. 5, when the first sliding portion 131 of the second supporting plate 130 is moved along the first guide rail 310 such that the first sliding portion 131 is positioned at the first flat portion 310*a* of the first guide rail 310, the second supporting plate 130 may be disposed at the first position Pol. In this case, the first supporting plate 110 and the second supporting plate 130 may be disposed at the same first position Po1 such that the first supporting plate 110 and the second supporting plate 130 are positioned on the same plane (e.g., on a plane that is parallel with a Z-X plane).

The third supporting plate 150 may have a plate-like shape having a quadrangular plane. Further, when the first to third supporting plates 110, 130, and 150 are slid open, the third supporting plate 150 may support the display panel P (see FIG. 8 and FIG. 9) together with the first supporting plate 110 and the second supporting plate 130.

In an exemplary embodiment of the present invention, the third supporting plate 150 may be slid along the pair of second guide rails 320 and 340. As a result, the third supporting plate 150 may be moved along the pair of second guide rails 320 and 340.

Opposite end portions of the third supporting plate 150 may be slidably coupled to the pair of second guide rails 320 and 340. The opposite end portions of the third supporting plate 150 indicate end portions that face the first guide plate 210 and the second guide plate 230 in the Z-axis direction.

A pair of second sliding portions 151 and 153 may be coupled to the opposite end portions of the third supporting plate 150. The second sliding portion 151 may be coupled to an end portion of the third supporting plate 150 which faces the first guide plate 210. The second sliding portion 153 may be coupled to an end portion of the third supporting plate 150 which faces the second guide plate 230.

The second sliding portion 151 may slide along the second guide rail 320, and the second sliding portion 153 may slide along the second guide rail 340. The second sliding portions 151 and 153 may have the same shape as the first sliding portions 131 and 133.

When the third supporting plate 150 slides along the pair of second guide rails 320 and 340, the third supporting plate 150 may be disposed at the first position Po1 or the third position Po3. For example, referring to FIG. 1, FIG. 3, and FIG. 4, when the second sliding portion 151 of the third supporting plate 150 is positioned at the fourth flat portion 320b of the second guide rail 320, the third supporting plate 150 may be disposed at the third position Po3. In this case, the third supporting plate 150 and the first supporting plate 110 may be disposed to overlap each other in the vertical direction, e.g., in the Y-axis direction.

However, referring to FIG. 2, FIG. 3, and FIG. 5, when the second sliding portion 151 of the third supporting plate 150 is moved along the second guide rail 320 such that the second sliding portion 151 is positioned at the third flat portion 320a of the second guide rail 320, the third supporting plate 150 may be disposed at the first position Po1. In this case, the first supporting plate 110, the second supporting plate 130, and the third supporting plate 150 may be disposed at the same first position Po1 such that the first supporting plate 110, the second supporting plate 130, and the third supporting plate 150 may be positioned on the same plane (e.g., on a plane that is parallel with the Z-X plane). As a result, the first supporting plate 110, the second supporting plate 130, and the third supporting plate 150 may be slid open from a stacked arrangement to form a continuous surface along the same plane. The unfolded display panel P (see FIG. 9) may be supported on the surface formed by sliding open the first supporting plate 110, the second supporting plate 130, and the third supporting plate 150.

Operations of the first supporting plate 110, the second supporting plate 130, and the third supporting plate 150 will be described with reference to FIG. 6. As illustrated in FIG. 6 (portion A), when the second supporting plate 130 is disposed at the second position Po2 of the first guide rail 310 (see FIG. 3) and the third supporting plate 150 is disposed at the third position Po3 of the second guide rail 320 (see FIG. 3), the first supporting plate 110, the second supporting plate 130 and the third supporting plate 150 may be disposed to overlap each other. As illustrated in FIG. 6 (portion B), the second supporting plate 130 may be moved along the first guide rail 310 (see FIG. 3), and the third supporting plate 150 may be moved along the second guide rail 320 (see FIG. 3). As illustrated in FIG. 6 (portion C), when the second supporting plate 130 and the third supporting plate 150 are respectively moved along the first guide rail 310 (see FIG. 3) and the second guide rail 320 (see FIG. 3), the first supporting plate 110, the second supporting plate 130, and the third supporting plate 150 may be disposed at the same first position Po1 such that the first supporting plate 110, the second supporting plate 130, and the third supporting plate 150 may positioned on the same plane.

Referring to FIG. 7, the first sliding portion 131 may be formed at an end portion of the second supporting plate 130. A first accommodating groove 131a, in which the first guide rail 310 of the bar-type member may be disposed, may be formed at the first sliding portion 131. When the first accommodating groove 131a is cut to be in parallel with a Y-Z plane, the first accommodating groove 131a may have a groove shape having an open side, the open side facing the first guide plate 210. Due to the shape of the first accommodating groove 131a, coupled to the first guide rail 310, the first sliding portion 131 can be prevented from moving in the Y-axis direction.

In an exemplary embodiment of the present invention, a second accommodating groove, having the same shape as that of the first accommodating groove 131a, may be formed in the pair of second sliding portions 151 and 153 in the third supporting plate 150. Due to the shape of the second accommodating groove, coupled to each of the second guide rails 320 and 340, the second sliding portions 151 and 153 can be prevented from moving in the Y-axis direction.

Referring to FIG. 8 and FIG. 9, a first panel accommodating portion 510 and a second panel accommodating portion 530 may be respectively coupled to the second supporting plate 130 and the third supporting plate 150. The first panel accommodating portion 510 and the second panel accommodating portion 530 may accommodate a portion of the display panel P positioned on the first to third supporting plates 110, 130, and 150.

The first panel accommodating portion 510 may be fixed and coupled to a first side surface of the second supporting plate 130. As illustrated in FIG. 8 and FIG. 9, when the second guide plate 230 is seen in a perspective view, the first panel accommodating portion 510 may be coupled to a right end portion of the second supporting plate 130. For example, when a user grips the first panel accommodating portion 510 by hand (or by a machine) to pull the first panel accommodating portion 510 in the X-axis direction, the second supporting plate 130 may slide along the first guide rails 310 and 330, together with the first panel accommodating portion 510.

The second panel accommodating portion 530 may be fixed and coupled to a first side surface of the third supporting plate 150. As illustrated in FIG. 8 and FIG. 9, when the second guide plate 230 is seen in a perspective view, the second panel accommodating portion 530 may be coupled to a left end portion of the third supporting plate 150. For example, when a user grips the second panel accommodating portion 530 by hand to pull the second panel accommodating portion 530 in the X-axis direction, the third supporting plate 150 may slide along the second guide rails 320 and 340, together with the second panel accommodating portion 530.

In an exemplary embodiment of the present invention, opposite end portions of the display panel P may be respectively accommodated in the first panel accommodating portion 510 and the second panel accommodating portion 530. For example, the opposite end portions of the display panel P may be rolled to be stored in the first panel accommodating portion 510 and the second panel accommodating portion.

Referring to FIG. 10, a first rolling bar AX that extends in a Z-axis direction may be disposed in the first panel accommodating portion 510. The first rolling bar AX may be a cylindrical member having a predetermined diameter. A first end portion of the display panel P may be fixed and coupled to an external circumferential surface of the first rolling bar AX.

When the first rolling bar AX is rotated in a clockwise direction, the display panel P may be rolled to the external circumferential surface of the first rolling bar AX. When the first rolling bar AX is rotated in a counterclockwise direction, the display panel P may be unrolled from (e.g., rolled out of) the external circumferential surface of the first rolling bar AX. As such, a portion of the display panel P may be moved into the first panel accommodating portion 510, or may be moved out from the first panel accommodating portion 510 by rotation of the first rolling bar AX.

An elastic member may be coupled to the first rolling bar AX. For example, the elastic member may be a coil spring, or the like. Unless an external force having a magnitude that is greater than a predetermined level is applied to the first panel accommodating portion 510, the first panel accommodating portion 510 may roll the display panel P to the external circumferential surface of the first rolling bar AX to store it therein by the action of the elastic member.

A second rolling bar that extends in the Z-axis direction may be disposed in the second panel accommodating portion 530. The second rolling bar may be a cylindrical member having a predetermined diameter. A second end portion of the display panel P may be coupled to an external circumferential surface of the second rolling bar.

A portion of the display panel P may be moved into the second panel accommodating portion 530 or may be moved out from the second panel accommodating portion 530 by rotation of the second rolling bar.

An elastic member may be coupled to the second rolling bar. For example, the elastic member may be a coil spring, or the like. Unless an external force having a magnitude that is greater than a predetermined level is applied to the second panel accommodating portion 530, the second panel accommodating portion 530 may roll the display panel P to the external circumferential surface of the second rolling bar to store it therein by the action of the elastic member.

According to an exemplary embodiment of the present invention, when the second supporting plate 130 and the third supporting plate 150 are respectively moved along the first guide rails 310 and 330 and the second guide rails 320 and 340, the display panel P may be moved into the first panel accommodating portion 510 and the second panel accommodating portion 530, or may be moved out of first panel accommodating portion 510 and the second panel accommodating portion 530.

For example, when the first supporting plate 110, the second supporting plate 130, and the third supporting plate 150 are overlapped by respectively disposing the first supporting plate 110, the second supporting plate 130, and the third supporting plate 150 at the first position Po1, the second position Po2, and the third position Po3, the opposite end portions of the display panel P are rolled and positioned in the first panel accommodating portion 510 and the second panel accommodating portion 530. In this case, the display panel P is exposed by as much as the width of the first supporting plate 110, the second supporting plate 130, or the third supporting plate 150. The widths of the first supporting plate 110, the second supporting plate 130, and the third supporting plate 150 are measured along the X-axis direction.

When the first supporting plate 110, the second supporting plate 130, and the third supporting plate 150 are sequentially disposed along the same plane, by disposing the first supporting plate 110, the second supporting plate 130, and the third supporting plate 150 at the first position Po1, the display panel P is moved out from the first panel accommodating portion 510 and the second panel accommodating portion 530. All regions of the display panel P for displaying images may be exposed to the outside.

In this case, the first supporting plate 110, the second supporting plate 130, and the third supporting plate 150 are flat, and are disposed on the same plane to support the display panel P. Thus, the display panel P may be maintained flat on the first supporting plate 110, the second supporting plate 130, and the third supporting plate 150.

Hereinafter, a display device, according an exemplary embodiment of the present invention, will be described with reference to FIG. 11 to FIG. 14. A duplicate description of elements described with reference to FIG. 1 to FIG. 10 may be omitted for brevity.

Figure 11:
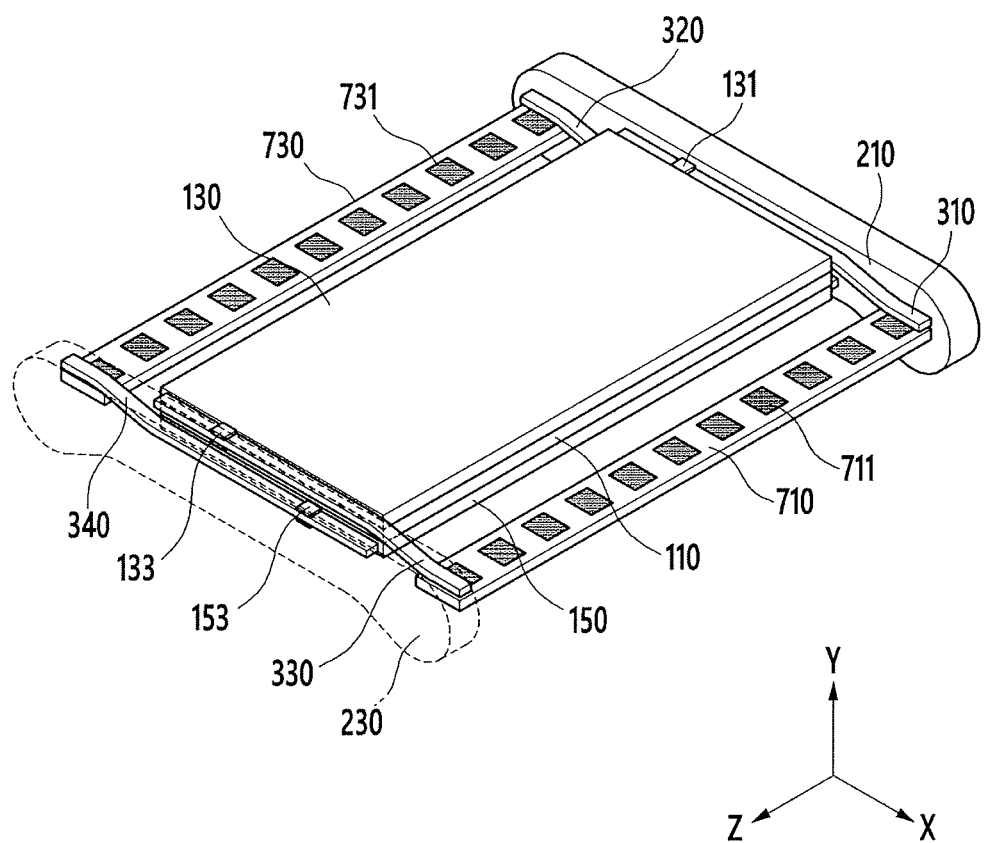
FIG. 11 and FIG. 12 are perspective views illustrating a display device according to an exemplary embodiment of the present invention.
Figure 12:
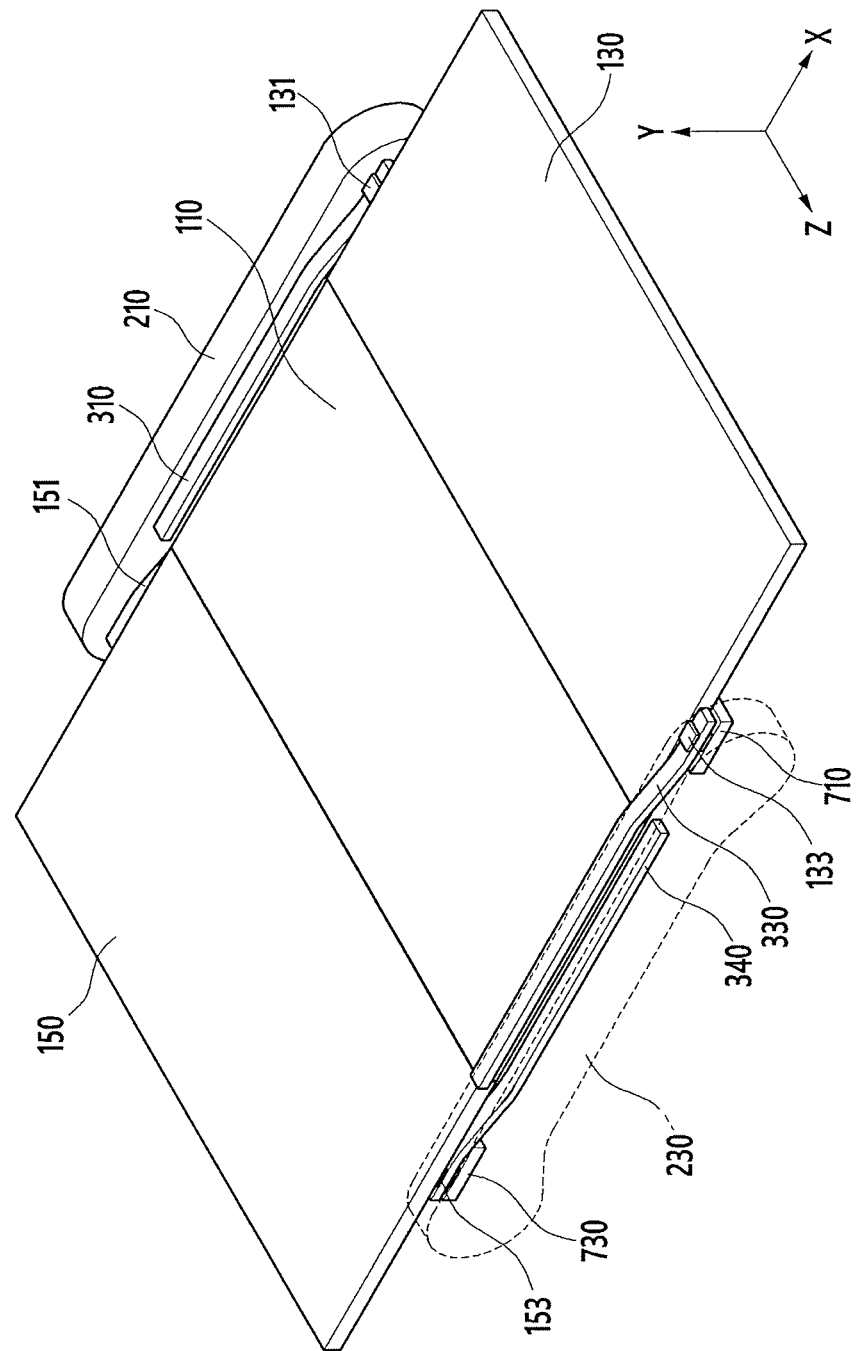
Figure 13:
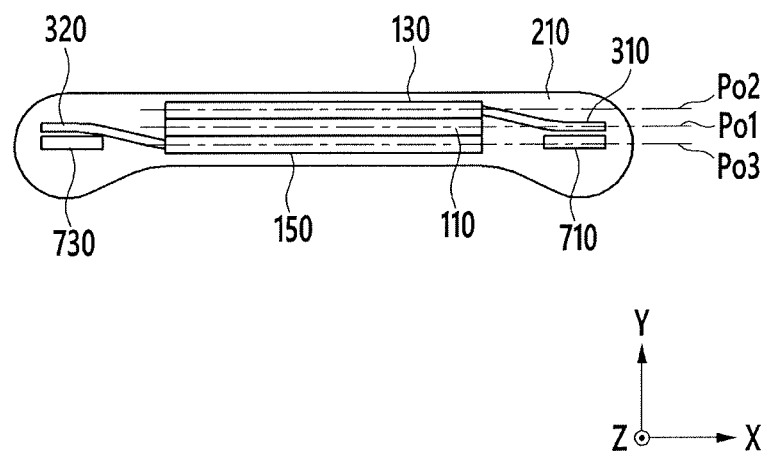
FIG. 13 and FIG. 14 illustrate operations of first to third supporting plates, according to an exemplary embodiment of the present invention.
Figure 14:
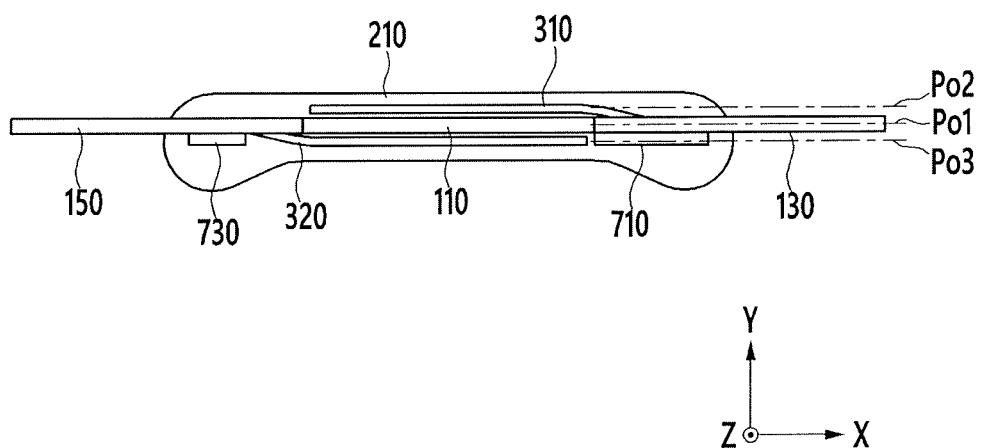

FIG. 11 and FIG. 12 are perspective views illustrating a display device according to an exemplary embodiment of the present invention. FIG. 13 and FIG. 14 illustrate operations of first to third supporting plates, according to an exemplary embodiment of the present invention.

Referring to FIG. 11 to FIG. 14, a first magnetic member 710 may be disposed below the first flat portion 310a of the first guide rail 310 (see FIG. 3), and a second magnetic member 730 may be disposed below the third flat portion 320a of the second guide rail 320 (see FIG. 3). When the second supporting plate 130 and the third supporting plate 150 are disposed at the first position Po1, the first magnetic member 710 and the second magnetic member 730 may respectively fix (e.g., hold in place) the second supporting plate 130 and the third supporting plate 150 by using magnetic force.

The first magnetic member 710 may have a plate shape that is extended in the Z-axis direction. A plurality of first magnets 711 may be disposed at predetermined intervals in the Z-axis direction in the first magnetic member 710.

Opposite end portions of the first magnetic member 710 may be respectively fixed to the first guide plate 210 and the second guide plate 230. Referring to FIG. 13 and FIG. 14, the opposite end portions of the first magnetic member 710 may be positioned below the first flat portion 310a of the first guide rail 310 (see FIG. 3).

When the second supporting plate 130 is moved from the second position Po2 to the first position Po1 by sliding along the first guide rail 310, the second supporting plate 130 contacts the first magnetic member 710, positioned below the first flat portion 310a (see FIG. 3). In this case, a metal plate (not illustrated) may be attached to the second supporting plate 130, contacting the first magnetic member 710 such that the second supporting plate 130 and the first magnetic member 710 are coupled to each other by a magnetic force.

As a result, in an exemplary embodiment of the present invention, when the second supporting plate 130 is moved to the first position Po1, the first supporting plate 110 and the second supporting plate 130 may be fixed to be disposed along the same plane by the action of the first magnetic member 710. Unless a user applies an external force having a predetermined magnitude in the X-axis direction, the first supporting plate 110 and the second supporting plate 130 may be fixed to form one continuous planar surface.

The second magnetic member may be formed to have a plate shape that is extended in the Z-axis direction. A plurality of second magnets 731 may be disposed at predetermined intervals in the Z-axis direction in the second magnetic member 730.

Opposite ends of the second magnetic member 730 may be respectively fixed to the first guide plate 210 and the second guide plate 230. The opposite end portions of the second magnetic member 730 may be positioned at the third flat portion 320a of the second guide rail 320 (see FIG. 3).

When the third supporting plate 150 is moved from the third position Po3 to the first position Po1 by sliding along the second guide rail 320, the third supporting plate 150 contacts the second magnetic member 730, positioned below the third flat portion 320a (see FIG. 3). In this case, a metal plate may be attached to the third supporting plate 150, contacting the second magnetic member 730, such that the third supporting plate 150 and the second magnetic member 730 are coupled to each other by a magnetic force.

As a result, in an exemplary embodiment of the present invention, when the third supporting plate 150 is moved to the first position Pol, the first supporting plate 110 and the third supporting plate 150 may be fixed to be disposed along the same plane by the action of the second magnetic member 730. Unless a user applies an external force having a predetermined magnitude in the X-axis direction, the first supporting plate 110 and the third supporting plate 150 may be fixed to form one continuous planar surface.

Hereinafter, a display device, according to an exemplary embodiment of the present invention, will be described with reference to FIG. 15 to FIG. 19. A duplicate description of elements described with reference to FIG. 1 to FIG. 14 may be omitted for brevity.

Figure 15:
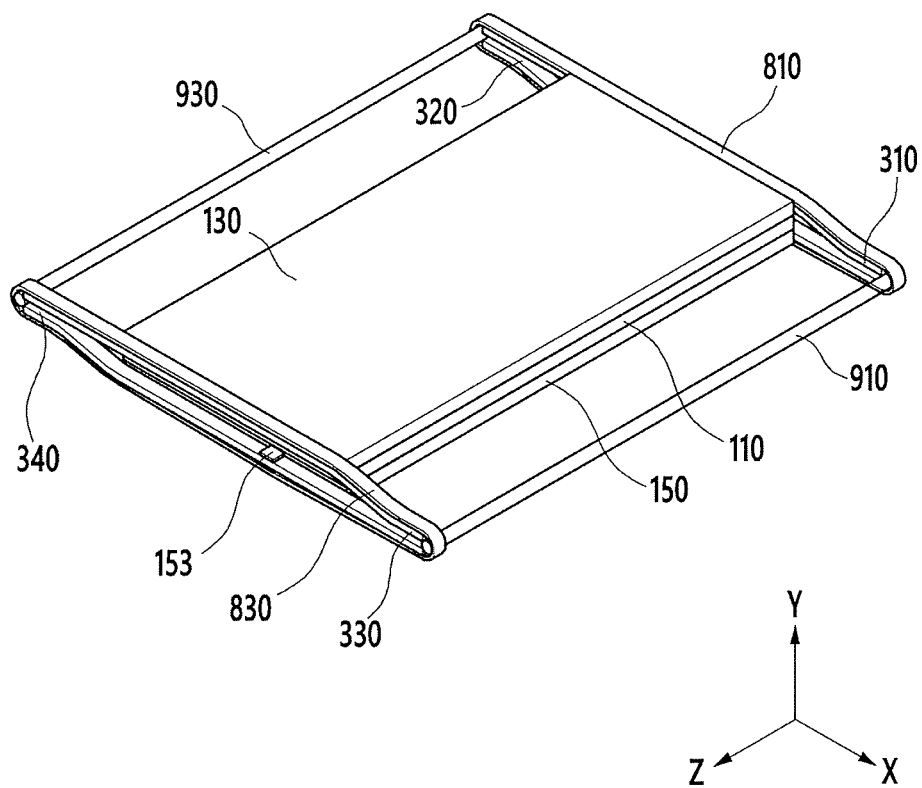
FIG. 15 is a perspective view illustrating a display device according to an exemplary embodiment of the present invention.
Figure 16:
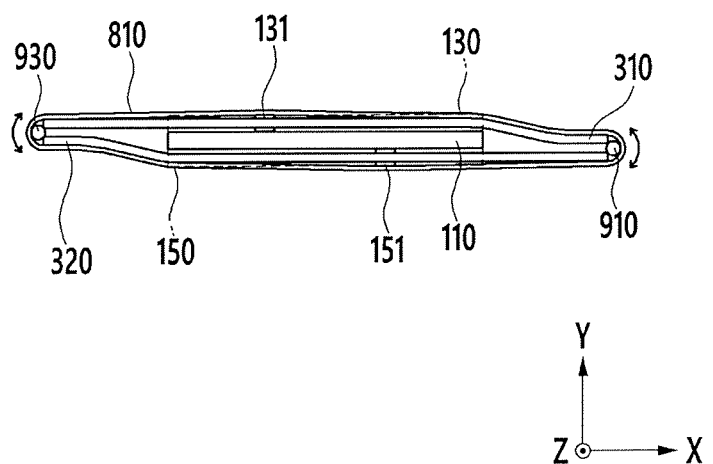
FIG. 16 and FIG. 17 illustrate operations of first to third supporting plates, according to an exemplary embodiment of the present invention.
Figure 17:
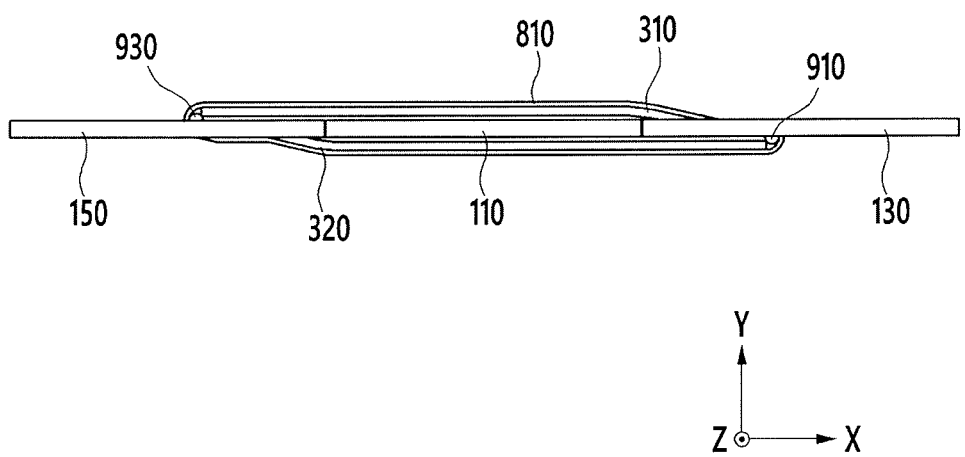
Figure 18:
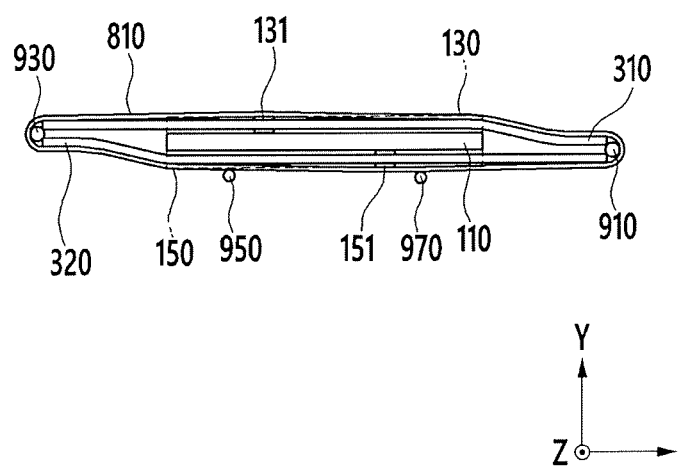
FIG. 18 and FIG. 19 illustrate the display device of FIG. 16 and FIG. 17 with additional rotation bars, according to an exemplary embodiment of the present invention.
Figure 19:
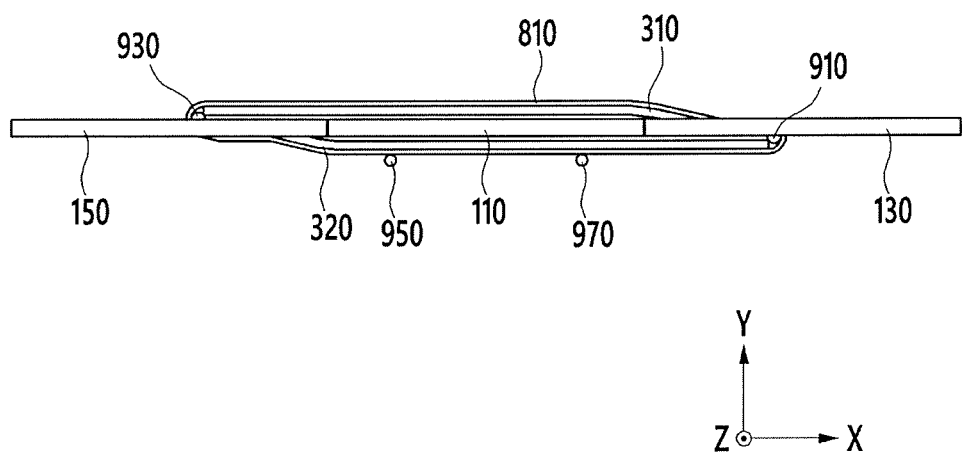

FIG. 15 is a perspective view illustrating a display device according to an exemplary embodiment of the present invention. FIG. 16 and FIG. 17 illustrate operations of first to third supporting plates, according to an exemplary embodiment of the present invention. FIG. 18 and FIG. 19 illustrate the display device of FIG. 16 and FIG. 17 with additional rotation bars, according to an exemplary embodiment of the present invention.

Referring to FIG. 15 to FIG. 17, belts 810 and 830 and rotation bars 910 and 930 may be disposed in the first guide plate 210 and the second guide plate 230 to allow the first sliding portions 131 and 133 and the second sliding portions 151 and 153 to slide. As the rotation bars 910 and 930, coupled to the belts 810 and 830, are rotated, the belts 810 and 830 may be rotated in a particular direction, and the first sliding portions 131 and 133 and the second sliding portions 151 and 153, coupled to the belts 810 and 830, may slide along the first guide rail 310 and the second guide rail 320.

Referring to FIG. 16 and FIG. 17, the belt 810 may be disposed to surround the first guide rail 310 and the second guide rail 320. The belt 810 may be positioned in the first guide plate 210 to rotate while surrounding the first guide rail 310 and the second guide rail 320. In addition, the belt 830 may be positioned in the second guide plate 230 to rotate while surrounding the first guide rail 330 and the second guide rail 340.

The belt 810, positioned in the first guide plate 210, may be rotated together with the first sliding portion 131 and the second sliding portion 151. In this case, the first sliding portion 131 and the second sliding portion 151 may be fixed and coupled to the belt 810.

Accordingly, when the belt 810 is rotated, the first sliding portion 131 and the second sliding portion 151 may be moved together. As a result, when the belt 810 is rotated, the first sliding portion 131 and the second sliding portion 151 may slide such that the second supporting plate 130 and the third supporting plate 150 may be rotated along the first guide rail 310 and the second guide rail 320. Thus, the second supporting plate 130 is moved to the first position Po1 or the second position Po2, and the third supporting plate 150 is moved to the first position Po1 or the third position Po3.

Referring to FIG. 15 to FIG. 17, at least one of the rotation bars 910 and 930 may be used to rotate the belts 810 and 830. The rotation bars 910 and 930 may be extended in the Z-axis direction to be coupled to the first guide plate 210 and the second guide plate 230, respectively.

In this case, the rotation bar 910 may be positioned to be adjacent to the first flat portion 310a of the first guide rail 310 (see FIG. 3). The rotation bar 930 may be positioned to be adjacent to the third flat portion 320a of the second guide rail 320 (see FIG. 3).

The belts 810 and 830 may be rotated according to rotation of the rotation bars 910 and 930. The belts 810 and 830 may be coupled to pulleys positioned at an external circumferential surface of the rotation bar 910.

Referring to FIG. 15 to FIG. 17, in an exemplary embodiment of the present invention, it is described that two rotation bars 910 and 930 are used, but the present invention is not limited thereto. For example, as shown in FIG. 18 and FIG. 19, four rotation bars 910, 930, 950, and 970 or more may be used.

A driver for rotating the rotation bars 910 and 930 may be coupled to the rotation bars 910 and 930. The driver serves to provide torque to the rotation bars 910 and 930, and an electrical motor or the like may be employed as the driver.

In a display device, according to an exemplary embodiment of the present invention, the first to third supporting plates 110, 130, and 150 may be slid open to be disposed adjacent to each other and to form a continuous surface, which includes the surfaces of each of the first to third supporting plates 110, 130, and 150 disposed along a same plane. For example, the first to third supporting plates 110, 130, and 150 may be consecutively arranged along the same plane to form the continuous surface, as shown in FIG. 2. In addition, the consecutively arranged first to third supporting plates 110, 130, and 150 may be slid back in place to be stacked on one another, as shown in FIG. 1, by moving the second supporting plate 130 and the third supporting plate 150 along the pair of first guide rails 310 and 330 and the pair of second guide rails 320 and 340. Further, when the display panel P is slid open, the first to third supporting plates 110, 130, and 150 can strongly support the display panel P and maintain the display panel P flat on the first to third supporting plates 110, 130, and 150.

While the present invention has been particularly shown and described with reference to exemplary embodiments thereof, it will be apparent to those of ordinary skill in the art that various changes in form and detail may be made therein without departing from the spirit and scope of the present invention as defined by the following claims.

What is claimed is:

1. A display device, comprising:
   first and second guide plates facing each other;
   a pair of first guide rails disposed in the first and second guide plates, respectively;
   a pair of second guide rails disposed in the first and second guide plates, respectively;
   a first supporting plate disposed between the first guide rails and the second guide rails at the first guide plate and the first and second guide rails at the second guide plate, wherein the first supporting plate has opposite end portions fixed to a first position of the first and second guide plates;
   a second supporting plate configured to have opposite end portions coupled to the pair of first guide rails;

a third supporting plate configured to have opposite end portions coupled to the pair of second guide rails; and
a display panel supported by at least one of the first to third supporting plates,
wherein the pair of first guide rails are respectively formed to extend from the first position to a second position, and
the pair of second guide rails are respectively formed to extend from the first position to a third position, wherein the first position is disposed between the second position and the third position.

2. The display device of claim 1, wherein portions of the pair of first guide rails and the second guide rails are overlapped with each other.

3. The display device of claim 2, wherein each of the pair of first guide rails includes:
a first flat portion positioned at the first position;
a second flat portion positioned at the second position; and
a first connector configured to connect the first flat portion with the second flat portion.

4. The display device of claim 3, wherein each of the pair of second guide rails includes:
a third flat portion positioned at the first position;
a fourth flat portion positioned at the third position; and
a second connector configured to connect the third flat portion with the fourth flat portion.

5. The display device of claim 4, wherein portions of the second flat portion and the fourth flat portion are overlapped with each other.

6. The display device of claim 4, wherein the first supporting plate is disposed between the second flat portion and the fourth flat portion.

7. The display device of claim 6, wherein the first flat portion and the third flat portion are disposed at opposite sides of the first supporting plate.

8. The display device of claim 4, further comprising:
a first panel accommodating portion fixed to a side of the second supporting plate, to accommodate a first end portion of the display panel.

9. The display device of claim 8, wherein a first rolling bar is disposed in the first panel accommodating portion, wherein the first rolling bar has an external circumferential surface to which the first end portion of the display panel is coupled, and the first rolling bar is configured to roll the first end portion of the display panel.

10. The display device of claim 8, further comprising:
a second panel accommodating portion fixed to a side of the third supporting plate to accommodate a second end portion of the display panel.

11. The display device of claim 10, wherein a second rolling bar is disposed in the second panel accommodating portion, wherein the second rolling bar has an external circumferential surface to which the second end portion of the display panel is coupled, and the second rolling bar is configured to roll the second end portion of the display panel.

12. The display device of claim 4, further comprising:
a first magnetic member disposed below the first flat portion, wherein opposite end portions of the first magnetic member are respectively fixed to the first and second guide plates.

13. The display device of claim 12, further comprising:
a second magnetic member disposed below the third flat portion, wherein opposite end portions of the second magnetic member are respectively fixed to the first and second guide plates.

14. The display device of claim 1, wherein each of two opposite end portions of the second supporting plate includes a first sliding portion coupled to one of the first guide rails, wherein the first sliding portion is configured to slide along the one of the first guide rails.

15. The display device of claim 14, wherein a first accommodating groove of the first sliding portion accommodates the one of the first guide rails.

16. The display device of claim 14, wherein each of two opposite end portions of the third supporting plate includes a second sliding portion coupled to one of the second guide rails, wherein the second sliding portion is configured to slide along the one of the second guide rails.

17. The display device of claim 16, wherein a second accommodating groove of the second sliding portion accommodates the second guide rail.

18. The display device of claim 16, further comprising:
a belt configured to surround the first guide rail and the second guide rail of the first guide plate, and rotate to move the first and second sliding portions, disposed adjacent to the first guide plate.

19. The display device of claim 18, further comprising:
at least one rotation bar having opposite end portions coupled to the first and second guide plates, wherein the at least one rotation bar is coupled to the belt and is configured to rotate the belt.

20. The display device of claim 19, further comprising:
a motor coupled to the at least one rotation bar and configured to rotate the at least one rotation bar.

21. The display device of claim 1, wherein each of the first to third supporting plates has a plate-like shape having a quadrangular plane.

22. The display device of claim 1, wherein the pair of second guide rails is separated from the pair of first guide rails.

23. The display device of claim 1, wherein opposite end portions of the second supporting plate are slidably coupled to the pair of first guide rails, respectively.

24. The display device of claim 1, wherein opposite end portions of the third supporting plate are slidably coupled to the pair of second guide rails, respectively.

* * * * *